(12) United States Patent
Peng et al.

(10) Patent No.: US 11,063,108 B2
(45) Date of Patent: Jul. 13, 2021

(54) ORGANIC LIGHT EMITTING DIODE ARRAY SUBSTRATE AND ELECTRONIC DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Liman Peng, Beijing (CN); Qi Liu, Beijing (CN); Yan Wu, Beijing (CN); Jin Yang, Beijing (CN); Qianqian Zhang, Beijing (CN); Zhiyong Xue, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/531,258

(22) Filed: Aug. 5, 2019

(65) Prior Publication Data
US 2020/0185483 A1    Jun. 11, 2020

(30) Foreign Application Priority Data
Dec. 6, 2018  (CN) .......................... 201822042482.3

(51) Int. Cl.
*H01L 27/32* (2006.01)
*H01L 23/00* (2006.01)
*H01L 25/18* (2006.01)
*G01R 31/28* (2006.01)
*H01L 27/12* (2006.01)

(52) U.S. Cl.
CPC ...... *H01L 27/3276* (2013.01); *G01R 31/2884* (2013.01); *H01L 24/08* (2013.01); *H01L 25/18* (2013.01); *H01L 24/05* (2013.01); *H01L 27/124* (2013.01); *H01L 27/3248* (2013.01); *H01L 2224/05005* (2013.01); *H01L 2224/08225* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,147,619 B2* | 9/2015 | Lee | ......................... | H01L 51/52 |
| 9,741,278 B2* | 8/2017 | Kang | ................... | G09G 3/3208 |
| 2016/0118420 A1* | 4/2016 | Yang | ................... | H01L 27/1255 257/40 |
| 2016/0321972 A1* | 11/2016 | Kang | ................... | G09G 3/3208 |
| 2020/0119126 A1* | 4/2020 | Jo | ....................... | H01L 27/1255 |

* cited by examiner

*Primary Examiner* — Telly D Green
(74) *Attorney, Agent, or Firm* — Leason Ellis LLP

(57) ABSTRACT

An organic light emitting diode array substrate and an electronic device. The organic light emitting diode array substrate includes a display region, and a first package test electrode and a first package test lead which are outside the display region. The display region includes a first power supply line and a first signal line; the first package test lead is configured to connect the first package test electrode with the first power supply line to provide a first supply voltage for the display region; the first signal line is configured to provide a first electrical signal for the display region; and a thermal conductivity of the first package test lead is higher than a thermal conductivity of the first signal line.

20 Claims, 3 Drawing Sheets

ORGANIC LIGHT EMITTING DIODE ARRAY SUBSTRATE AND ELECTRONIC DEVICE

The application claims priority to the Chinese patent application No. 201822042482.3, filed on Dec. 6, 2018, the entire disclosure of which is incorporated herein by reference as part of the present application.

TECHNICAL FIELD

Embodiments of the present disclosure relate to an organic light emitting diode array substrate and an electronic device.

BACKGROUND

In the field of display, organic light-emitting diode (OLED) display panels have characteristics of autoluminescence, high contrast, low power consumption, wide viewing angle, fast response, capability of being applied to flexible panels, wide temperature range, and simple manufacturing process, and have broad development prospect. How to optimize a manufacturing process of the OLED display panel is a concerned problem in the field.

SUMMARY

Embodiments of the present disclosure provide an organic light-emitting diode (OLED) array substrate, comprising a display region, a first package test electrode and a first package test lead outside the display region. The display region comprises a first power supply line and a first signal line; the first package test lead is configured to connect the first package test electrode and the first power supply line to provide a first supply voltage for the display region; the first signal line is configured to provide a first electrical signal for the display region; and a thermal conductivity of the first package test lead is higher than a thermal conductivity of the first signal line.

In at least an example, the display region further comprises a second signal line which is configured to provide a second electrical signal for the display region; and the first package test lead and the second signal line are in a same layer and made of a same material.

In at least an example, the first signal line is a scanning line, and the second signal line is a data line.

In at least an example, the display region comprises a light emitting element and a pixel circuit for driving the light emitting element to emit light; the pixel circuit comprises a thin-film transistor; the thin film transistor comprises a source/drain electrode layer; and the source/drain electrode layer and the second signal line are in a same layer and made of a same material.

In at least an example, the thin film transistor comprises a gate electrode layer; and the gate electrode layer and the first signal line are in a same layer and made of a same material.

In at least an example, the first package test electrode and a conductive layer, which is farthest away from a base substrate, of the pixel circuit, are in a same layer and made of a same material.

In at least an example, the first package test electrode and the source/drain electrode layer are in a same layer and made of a same material.

In at least an example, the thermal conductivity of the first package test lead is greater than 138 W/(m·K).

In at least an example, a material of the first package test lead is gold, silver, copper, aluminum, magnesium or alloy materials thereof.

In at least an example, the OLED array substrate further comprises a second package test electrode and a second package test lead which are outside the display region; the display region comprises a common electrode line; the second package test lead is configured to connect the second package test electrode and the common electrode line to provide a second supply voltage corresponding to the first supply voltage; and the second supply voltage is lower than the first supply voltage.

In at least an example, the OLED array substrate further comprises a light emitting element; the light emitting element comprises a first electrode, a second electrode and a light emitting layer between the first electrode and the second electrode; and the common electrode line is electrically connected with the first electrode or the second electrode of the light emitting element.

In at least an example, the second package test lead is on a side of the first package test lead away from the display region.

In at least an example, the OLED array substrate further comprises a first module bonding pad and a first module bonding lead which are outside the display region; the first module bonding lead is configured to connect the first module bonding pad and the first power supply line to provide a third supply voltage for the display region.

In at least an example, the first module bonding pad is in a comb structure.

In at least an example, the first module bonding pad and the first package test electrode are on different sides of the display region.

In at least an example, the OLED array substrate further comprises a second module bonding pad and a second module bonding lead which are outside the display region; the display region comprises a common electrode line; and the second module bonding lead is configured to connect the second module bonding pad and the common electrode line to provide the display region with a fourth supply voltage corresponding to the third supply voltage.

In at least an example, the OLED array substrate further comprises a light emitting element; the light emitting element comprises a first electrode, a second electrode and a light emitting layer between the first electrode and the second electrode; and the common electrode line is electrically connected with the first electrode or the second electrode of the light emitting element.

In at least an example, the second module bonding lead is on a side of the first module bonding lead away from the display region.

In at least an example, the OLED array substrate further comprises a planarization layer and a pixel defining layer on the first package test lead.

The embodiments of the present disclosure further provide an electronic device, comprising the above OLED array substrate, and the first package test electrode is floating.

In at least an example, the electronic device further comprises a first module bonding pad and a first module bonding lead which are outside the display region; the first module bonding lead is configured to connect the first module bonding pad and the first power supply line to provide a third supply voltage for the display region.

In at least an example, the electronic device further comprises an integrated circuit (IC) chip; the IC chip is electrically connected with the array substrate through the first module bonding pad to provide the first supply voltage or the first electrical signal for the array substrate.

In at least an example, the electronic device further comprises a flexible printed circuit, and the IC chip is bonded with the first module bonding pad through the flexible printed circuit.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

OLED display panels usually undergo three process stages in sequence in the manufacturing process: TFT array process stage, cell process stage and module process stage. For example, in the TFT array process stage, firstly, a TFT driving circuit array is formed on a base substrate by semiconductor process; secondly, OLEDs are formed by inkjet printing, evaporation, etc.; and thirdly, the OLED display panel is formed by packaging technology. For instance, in the cell process stage, the OLED display panel is subjected to aging process to stabilize the TFT performance and stabilize the luminance of the OLED, and the OLED display panel is subjected to a package test to detect poor display of the display region in the display panel. For example, in the module process stage, the display panel is subjected to a chip bonding (various driver chips, etc.) to form a display module, and the display module is tested to detect the defects of the display module.

Figure 1:
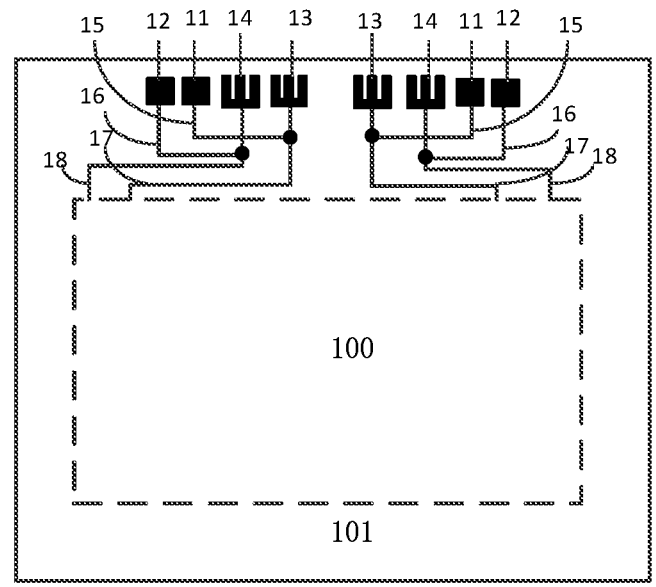
FIG. 1 is a schematic plan view of an OLED display panel.

FIG. 1 is a schematic plan view of an OLED display panel. The display panel comprises a display region 100 and a peripheral region 101 disposed on the outside of the display region. The display region includes an array of sub-pixels, scanning lines (gate lines) for providing scanning signals for the array, data lines for providing data signals, power supply lines for providing a supply voltage, etc. Each sub-pixel includes a pixel circuit and a light emitting element (OLED). The pixel circuit is connected with the gate line, the data line and the power supply line to receive corresponding electrical signals to drive the OLED to emit light, so as to achieve display.

In the above display panel test and display module test, test signals are respectively input into the display panel through bonding pads outside the display region of the display panel. FIG. 1 mainly shows bonding pads (e.g. package test pad and module bonding pad) which provide supply voltage signals, and bonding leads (e.g. package test lead and module bonding lead) which are connected with the bonding pads in the peripheral region 101 of the display panel. As shown in the figure, a package test electrode 11 and a module bonding pad 13 are respectively connected to a power supply line (not shown) in the display region through a package test lead 15 and a module bonding lead 17, and a package test electrode 12 and a module bonding pad 14 are respectively connected to a common electrode line (not shown) in the display region through a package test lead 16 and a module bonding lead 18. The package test electrodes 11 and 12 are respectively configured to provide a high voltage signal VDD and a low voltage signal VSS for the display region in the cell process stage, and the module bonding pads 13 and 14 are respectively configured to provide a high voltage signal ELVDD and a low voltage signal ELVSS for the display region in the module process stage.

In order to save the process steps, for example, the bonding leads on the circumference of the display region are either formed in a same patterning process with the data lines in the display region, or formed in a same patterning process with the scanning lines in the display region. As shown in FIG. 1, in order to further optimize wiring, the module bonding leads 17 and 18 and the data lines in the display region are formed in a same layer; and in order to avoid a short circuit between the package test lead 16 and the module bonding lead 18, the package test leads 15 and 16 and the scanning line in the display region are formed in a same layer and in another layer. Correspondingly, insulating layers (e.g., a gate insulator layer, a passivation layer, a planarization layer and a pixel define layer (PDL)), package layers and the like are formed on the package test leads 15 and 16, and on the module bonding leads 17 and 18 respectively. The insulating layers include inorganic insulating layers or organic insulating layers. The package test electrodes 11 and 12 are, for instance, formed in a same layer with the scanning lines. The module bonding pads 13 and 14 are, for instance, formed in a same layer with the data lines and are connected with corresponding leads directly or via through holes. For instance, the package test electrodes 11 and 12 and the module bonding pads 13 and 14 are arranged in a same layer with the upmost conductive layer in the pixel circuit. For instance, the package test electrodes 11 and 12 and the module bonding pads 13 and 14 are all formed in a same layer with the data lines in the display region.

In the cell process of the OLED display panel, due to various factors such as process conditions and materials, movable stray charges exist in a TFT element taken as a driving part or a switching part of the sub-pixel, in particular, in an active layer, which can cause a TFT electric leakage and a tail-hanging phenomenon and correspondingly affect a display quality of the display panel. It is necessary to perform an aging process on the display panel to adjust the stray charges in the device and alleviate the leakage and tail-hanging problem of the TFT element. For example, in the aging process, higher voltage signals are input into the display panel to adjust the stray charges in the element.

The inventors have found that when performing the aging process on the display panel in the cell process stage, it is necessary to provide a relatively high voltage signal VDD, for example, 15V, to the pixel array of the display region, so the package test lead 15 may generate relatively high heat in an instant. If the material of the package test lead 15 has a relatively low thermal conductivity and is covered by a large number of insulating layers, the heat will not be easily dissipated, and organic material layers above the lead can be easily burned and peeled off, resulting in defects. For example, in the field of display, molybdenum is often chosen as the gate metal material of transistors because of its excellent performances. In a case where the scanning lines and gate electrodes are formed in a same layer, the material of the scanning lines is also metal molybdenum, and the material of the package test lead 15 formed in the same layer is also molybdenum. Since the thermal conductivity of molybdenum is 138 W/(m·K) and is relatively low, and the input high voltage in the package test lead 15 generates a large amount of heat which will not be easily dissipated in a short time, the organic material layers above the package test lead 15 are burned and peeled off.

Some embodiments of the present disclosure provide an array substrate, which comprises a display region and a first package test electrode and a first package test lead disposed on the outside of the display region. The display region includes a first power supply line and a first signal line; the first package test lead is configured to connect the first package test electrode and the first power supply line to provide a first supply voltage for the display region; the first signal line is configured to provide a first electrical signal for the display region; and a thermal conductivity of the first package test lead is higher than a thermal conductivity of the first signal line.

In some embodiments of the present disclosure, as the thermal conductivity of the first package test lead is set to be higher than that of the first signal line, so as to prevent the material of the first package test lead from being the same with the material of the signal line with a lower thermal conductivity, so that the thermal conductivity of the first package test lead is relatively high, thereby avoiding the case that the organic material layers (e.g., the planarization layer and the PDL) above the first package test lead are burned as the heat cannot be easily dissipated when the first package test lead transmits the first supply voltage.

Figure 2A:
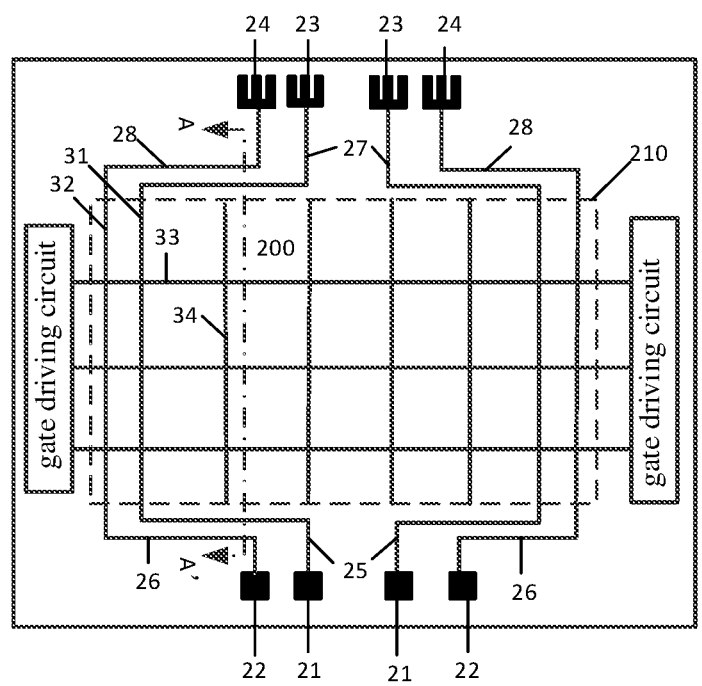
FIG. 2A is a schematic plan view of an array substrate provided by an embodiment of the present disclosure.

FIG. 2A is a schematic plan view of an array substrate provided by an embodiment of the present disclosure. For instance, the array substrate 20 is an OLED array substrate, but no limitation will be given here in the embodiment of the present disclosure.

As shown in FIG. 2A, the array substrate 20 comprises a display region 210 and a first package test electrode 21 and a first package test lead 25 which are disposed in a peripheral region on the outside of the display region 210; the display region 210 includes a first power supply line 31 and a first signal line 33; the first package test lead 25 is configured to connect the first package test electrode 21 with the first power supply line 31 to provide a first supply voltage for the display region 210; the first signal line 33 is configured to provide a first electrical signal for the display region 210; and the thermal conductivity of the first package test line 25 is higher than that of the first signal line 33.

For instance, the array substrate 20 further comprises a second package test electrode 22 and a second package test lead 26 which are disposed on the outside of the display region 210; the second package test lead 26 is configured to provide a second supply voltage corresponding to the first supply voltage for the display region 210; and the second supply voltage is lower than the first supply voltage. For instance, the first supply voltage is a high voltage signal, e.g., VDD; and the second supply voltage is a low voltage signal, e.g., VSS.

For instance, the array substrate 20 further comprises a second signal line 34 which is configured to provide a second electrical signal for the display region 210; and the first package test lead 25 and the second signal line 34 are arranged in a same layer and made of a same material.

It should be noted that "arranged in a same layer" in the present disclosure means that a plurality of structures are formed by a same material through a same patterning process or different patterning processes, thereby being formed in a same layer structure with respect to a base substrate, and structures arranged in "the same layer" may have same height with respect to the same plane, or may have different heights, and may have same thickness, or may have different thicknesses, and no limitation will be given here in the embodiment of the present disclosure.

A plurality of first signal lines 33 and a plurality of second signal lines 34 are intersected with each other to define a plurality of pixel regions; and the array substrate comprises a plurality of sub-pixels 200 which are arranged in the plurality of pixel regions in one-to-one correspondence. For instance, the array substrate 20 is an OLED array substrate, and each sub-pixel includes a light emitting element OLED and a pixel circuit that drives the OLED to emit light. For instance, the pixel circuit may include conventional 2T1C, 3T1C or an OLED pixel circuit further having a compensation function, a reset function, and the like, and no limitation will be given here in the embodiment of the present disclosure.

For instance, the first signal line 33 is a scanning line (gate line); the second signal line 34 is a data line; and the first electrical signal and the second electrical signal are respectively a scanning signal and a data signal. Each sub-pixel 200 is connected with the first signal line 33, the second signal line 34 and the first power supply line 31 to receive corresponding electrical signal to emit light, so as to achieve display.

For instance, the first package test electrode 21 is in a block shape.

For instance, in the cell process stage of the display device, pins or probes of a test device are electrically connected with the first package test electrode 21 by alignment contact and input test signals into the first package test electrode 21. For instance, the test signal includes the first supply voltage. For instance, the first supply voltage is 5V, 10V or more.

For instance, in the aging process of the OLED display device, pins of an aging device (e.g., a clamping device) are electrically connected with the first package test electrode 21 by alignment contact and input aging signals into the first package test electrode 21. For instance, the aging signal includes the first supply voltage, so the first supply voltage is applied to the sub-pixel through the first power supply line. For instance, the first supply voltage is 15V or more.

For instance, the first power supply line 31 and the second signal line 34 have a same extension direction.

For instance, the thermal conductivity of the first package test lead 25 is greater than the thermal conductivity (138 W/(m·K)) of the metal molybdenum.

For instance, the material of the first package test lead 25 is gold, silver, copper, aluminum, magnesium or alloy materials thereof; and the material of the first signal line is molybdenum, nickel, chromium or alloy materials thereof.

Figure 2B:
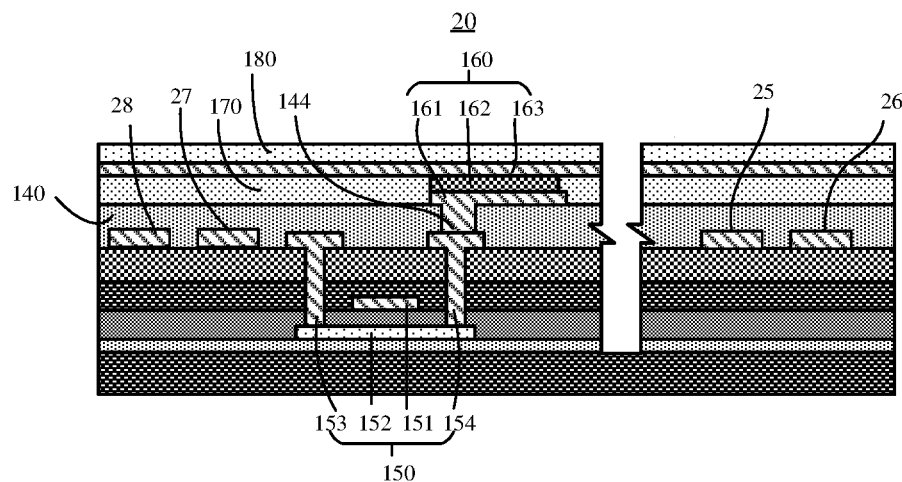
FIG. 2B is a sectional view of the array substrate as shown in FIG. 2A along the sectional line A-A'.

FIG. 2B is a sectional view of one example of the array substrate as shown in FIG. 2A along the sectional line A-A'. For clarity, the sectional view only shows a light emitting element (OLED) 160 and a TFT 150 directly connected with the light emitting element in the pixel circuit. The TFT 150 is, for instance, a driving transistor that drives the light emitting element 160 to emit light and may also be an emission control transistor or the like that controls a current driving the light emitting element 160 to emit light to flow across or not. No limitation will be given here in the embodiment of the present disclosure.

For instance, the TFT 150 includes a gate electrode 151, an active layer 152 and a source/drain electrode layer (including a source electrode 153 and a drain electrode 154). The type, the material and the structure of the TFT 150 are not limited in the embodiment of the present disclosure and, for instance, the TFT 150 may be a top-gate type, bottom-gate type, etc. The active layer of the TFT 150 may be amorphous silicon, polysilicon (such as low temperature polysilicon or high temperature polysilicon), oxide semiconductor (such as indium gallium zinc oxide (IGZO)). The TFT 150 may be N type or P type.

For instance, the source/drain electrode layer of the TFT 150 and the second signal line 34 are arranged in a same layer and made of a same material, for instance, made of metal aluminum.

For instance, the gate electrode 151 of the TFT 150 and the first signal line 33 are arranged in a same layer and made of a same material, for instance, made of metal molybdenum.

As shown in FIG. 2B, the light emitting element 160 includes a first electrode 161, a light emitting layer 162 and a second electrode 163. For instance, the first electrode 161 is a pixel electrode and the second electrode 163 is a common electrode. One of the first electrode 161 and the second electrode 163 is an anode and the other one is a cathode. For instance, the first electrode 161 is an anode and the second electrode 163 is a cathode. For instance, in at least one example, apart from the light emitting layer 162, the light emitting element 160 may also include at least one of a hole injection layer (HIL), a hole transport layer (HTL), an electron injection layer (EIL) or an electron transport layer (ETL).

For instance, the display region includes a common electrode line (second power supply line) 32, and the second package test lead 26 is configured to be connected with the common electrode line 32 to provide the second supply voltage (VSS). In the working process, the first supply voltage and the second supply voltage are applied to the sub-pixel to drive the light emitting element therein to emit light, so as to realize display. For instance, the second supply voltage is 0V, −3V or −5V. For instance, the common electrode line 32 is electrically connected with the first electrode or the second electrode of the light emitting element 160, which is therefor the common electrode. For instance, the common electrode line 32 is electrically connected with the cathode (for instance, the above second electrode 163) of the light emitting element 160.

For instance, the second package test lead 26 is closer to the edge of the array substrate 20 compared with the first package test lead 25, that is, the second package test lead 26 is disposed on a side of the first package test lead 25 away from the display region. As the common electrode line 32 is usually closer to the inner edge of the display region 210 compared with the first power supply line 31, for instance, arranged around the inside of the display region, convenient wiring can be realized by allowing the second package test lead 26 to be closer to the edge of the array substrate 20 compared with the first package test lead 25.

For instance, the light emitting element 160 may be a top-emission, bottom-emission or double-sided emission structure. For instance, the light emitting element 160 is a top-emission structure. The first electrode 161 is reflective and the second electrode 163 is transparent or translucent. For instance, the first electrode 161 is made from transparent conductive oxide materials such as indium tin oxide (ITO). For instance, the first electrode 161 is made of a material with a high work function and then taken as the anode, for instance, is an ITO/Ag/ITO stacked layer structure; and the second electrode 163 is made of a material with a low work function and then taken as the cathode, for instance, is translucent metal or metal alloy material, e.g., Ag/Mg alloy material.

For instance, the array substrate 20 further comprises a planarization layer 140. The planarization layer covers the first signal line 33, the first package test lead 25, the second signal line 34, the second package test lead 26 and the TFT 150, and provides a basically flat surface. The first electrode 161 of the light emitting element 160 is electrically connected with the source electrode or the drain electrode of the TFT 150 via a through hole 144 in the planarization layer.

For instance, a PDL 170 is formed on the planarization layer 140 and the first electrode 161; an opening is formed at a position of the PDL 170 corresponding to the first electrode 161 to at least partially expose the first electrode 161; an light emitting layer 162 is formed in the opening; and the second electrode 163 is formed on the light emitting layer 162 and the PDL.

For instance, the material of the planarization layer 140 and the PDL 170 is an organic material or an inorganic material. For instance, the organic material is resin such as polyimide (PI).

An overcoat (OC) layer 180 is formed on the second electrode 163. The OC layer 180 is, for instance, an inorganic OC layer or a superimposed layer of an inorganic OC layer and an organic OC layer. In addition, the OC layer 180 may further include reducing materials and/or hygroscopic materials to avoid adverse effects of oxygen/water vapor on the light emitting elements 160.

For instance, as shown in FIGS. 2A and 2B, the array substrate 20 further comprises a first module bonding pad 23 and a first module bonding lead 27 disposed on the outside of the display region 210; and the first module bonding pad 23 is connected to the first power supply line 31 through the first module bonding lead 27 to provide a third supply voltage for the sub-pixel of the display region. The third supply voltage is a high voltage signal, e.g., ELVDD. For instance, the first module bonding lead 27 is also arranged in a same layer and made of a same material as the second signal line 34.

For instance, the first module bonding pad 23 is a comb structure and includes a plurality of alternately arranged sub-electrodes. For instance, the first module bonding pad 23 is configured to be bonded with an FPC to form a display module. The FPC provides supply voltages for the display region 210 through the first module bonding pad 23.

For instance, in the module process stage of the display device, pins or probes of a test device are electrically connected with contact pads of the FPC, and the FPC is bonded with the first module bonding pad 23 to input test signals into the first module bonding pad 23. For instance, the test signal includes the third supply voltage. For instance, the third supply voltage is 5V, 10V or more.

For example, the bonding method is FPC crimping. For example, the first module bonding pad 23 is bonded to the FPC by crimping through an anisotropic conductive film (ACF). The ACF may allow the two bonded objects to be electrically conducted in the vertical direction and insulated in the horizontal direction, that is, conducted in the film thickness direction and insulated in the line width direction. The ACF is a structure in which an insulating adhesive (for example, resin) encloses conductive particles (for example, gold or nickel), and an outer surface of the conductive particle is also covered with an insulating film. Before bonding, the conductive particles are evenly distributed in the adhesive without contact with each other; and during bonding, at certain temperature and pressure, the insulating film on the outside of the conductive particle is broken, and the conductive particles are extruded together to form conduction. Compared to the conventional soldering process, the ACF bonding process provides finer insulation spacing and higher precision and then can increase the wiring density.

For instance, the array substrate 20 further comprises a second module bonding pad 24 and a second module bonding lead 28; and the second module bonding lead 28 is configured to connect the second module bonding pad 24 with the common electrode line 32 in the display region 210 to provide a fourth supply voltage corresponding to the third supply voltage. For example, the spacing between the first module bonding pad 23 and the second module bonding pad 24 can reach 10 microns or less; and accordingly, the insulation spacing of the ACF can reach 10 microns or less.

For instance, the second module bonding lead 28 is closer to the edge of the array substrate 20 compared with the first module bonding lead 27, that is, the second module bonding lead 28 is disposed on a side of the first module bonding lead 27 away from the display region. As the common electrode line 32 is usually closer to the inner edge of the display region 210 compared with the first power supply line 31, for instance, arranged around the inside of the display region, convenient wiring can be realized by allowing the second module bonding lead 28 to be closer to the edge of the array substrate 20 compared with the first module bonding lead 27.

For instance, the first package test electrode 21, the second package test electrode 22, the first module bonding pad 23 and the second module bonding pad 24 are all arranged in a same layer and made of a same material with an upmost conductive layer (namely the conductive layer which is the farthest away from the base substrate) in the pixel circuit, so as to be easily connected with an external device (for instance, probes or pins of a test device hereafter, the FPC, etc.) to receive test signals, driving signals, etc. For instance, the first package test electrode 21, the second package test electrode 22, the first module bonding pad 23 and the second module bonding pad 24 are all arranged in a same layer and made of a material with the second signal line 34.

For instance, in some embodiments, the first module bonding pad 23 and the first package test electrode 21 are disposed on different sides or a same side (for instance, may refer to the electrode layout as shown in FIG. 1) of the display region 210.

Figure 4:
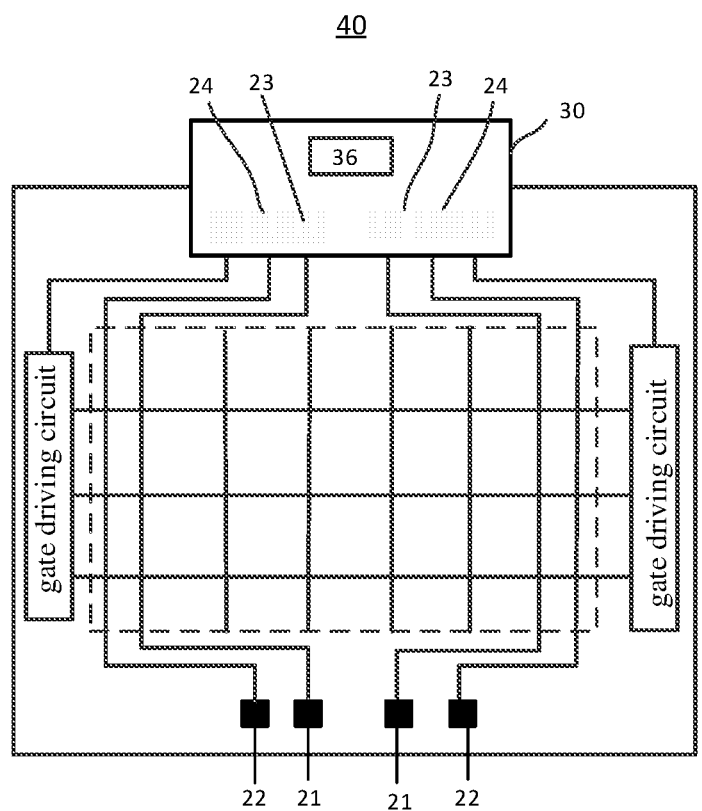
FIG. 4 is a schematic plan view of an electronic device provided by an embodiment of the present disclosure.

For instance, the first module bonding pad 23 and the first package test electrode 21 are disposed on two opposite sides of the display region 210. As shown in FIGS. 2A and 4, the first module bonding pad 23, the first module bonding lead 27, the second module bonding pad 24 and the second module bonding lead 28 are disposed on an upper side of the display panel in the figure; and the first package test electrode 21, the first package test lead 25, the second package test electrode 22 and the second package test lead 23 are disposed on a lower side of the display panel in the figure. The setting helps to reduce the density of wires in the peripheral region, not only reducing the short-circuit risk among the wires but also further improving the radiating efficiency of the wiring region.

For instance, the array substrate 20 further comprises a gate driving circuit. For instance, the gate driving circuit is electrically connected with the first signal line 33 to provide scanning signals for the display region 210. For instance, the gate driving circuit is at a different side of the display region 210 from the first module bonding pad 23 and the first package test electrode 21. For instance, the gate driving circuit adopts a gate driver on array (GOA) structure.

Figure 3:
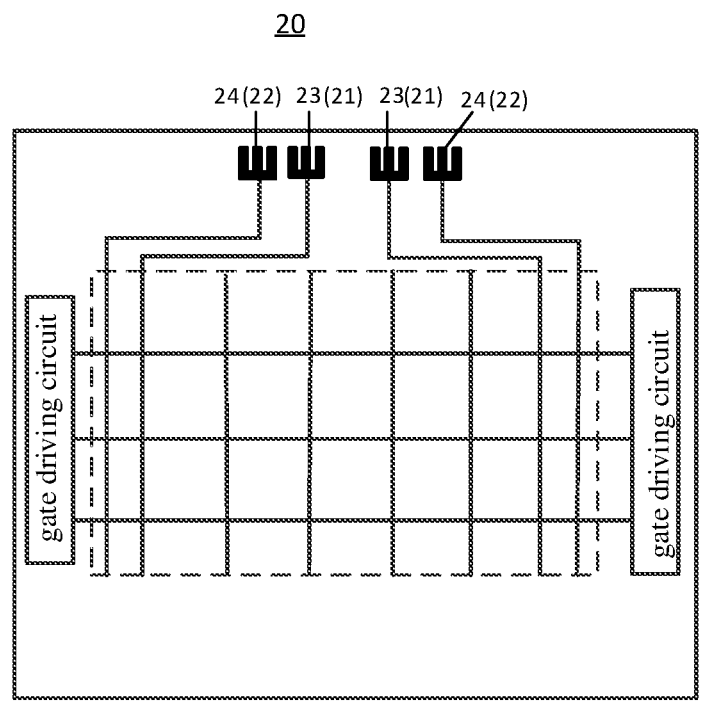
FIG. 3 is a schematic plan view of an array substrate provided by another embodiment of the present disclosure.

FIG. 3 is a schematic plan view of an array substrate provided by some embodiments of the present disclosure. Different from the array substrate as shown in FIGS. 2A and 2B, in the array substrate provided by the embodiment, the first module bonding pad 23 is multiplexed as the first package test electrode 21, and the second module bonding pad 24 is multiplexed as the second package test electrode 22, that is, the first package test electrode 21 and the second package test electrode 22 are not additionally arranged. This setting mode helps to reduce the wiring density while allowing the first package test lead (namely the first module bonding lead) to be arranged in a same layer with the signal lines with a higher thermal conductivity, which not only reduces a short-circuit risk among the wires but also further improves a radiating efficiency of the wiring region. In these embodiments, as the first package test electrode 21 and the second package test electrode 22 are in comb structures, the connection mode and the bonding mode must be matched with the shape of the electrodes. For instance, the first package test electrodes 21 and the second package test electrodes 22 are configured to establish electric contact with the pins or the probes of the test device to perform aging and test processes in the cell process stage, and to receive signals from the pins or the probes of the test device from the FPC to perform detection after being bonded with the FPC in the module process stage.

Some embodiments of the present disclosure further provide an electronic device, which comprises the above array substrate. FIG. 4 is a schematic diagram of the electronic device provided by the embodiment of the present disclosure. As shown in the figure, the electronic device 40 comprises the array substrate 20 and an IC chip 36. The IC chip 36 is electrically connected with the array substrate 20 to provide driving signals (for instance, the first supply voltage, the second supply voltage, the first electrical signals and the second electrical signals) for the array substrate 20. For instance, the IC chip 36 is bonded with the array substrate 20 through an FPC 30.

For instance, the IC chip 36 is bonded with the FPC 30 to form a chip on FPC (COF) structure.

For instance, the IC chip is mounted on a transfer board and then electrically connected with the FPC 30 through the bonding of the transfer board and the FPC 30, and finally electrically connected with the array substrate 20.

For instance, the electronic device further comprises an ACF which is disposed between the array substrate 20 and the FPC 30 to realize the bonding connection between both.

For instance, the FPC 30 is bonded with the first module bonding pad 23 and the second module bonding pad 23 to provide the first supply voltage and the second supply voltage for the array substrate 20.

For instance, the FPC 30 also provides, for instance, clock signals, power supply signals and the like for the gate driving circuits through the bonding pads.

For instance, the first package test electrodes 21 and the second package test electrodes 22 are floating, namely not electrically connected with an external circuit.

For instance, the electronic device 40 is an OLED display panel.

For instance, the electronic device 40 may be any product or component employing the OLED display panel such as a smart bracelet, a smart watch, a mobile phone, a tablet PC, a TV, a display, a notebook computer, a digital album or a navigator.

As the thermal conductivity of the first package test lead is set to be higher than that of the first signal line, the embodiment of the present disclosure avoid the case that the material of the first package test lead is the same with that of the signal line with a lower thermal conductivity, and then avoid the case that the organic material layers (for instance, the planarization layer and the PDL) above the first package test leads are burned as the heat cannot be easily dissipated when the first package test leads transmit the first supply voltage.

What are described above is related to the illustrative embodiments of the disclosure only and not limitative to the scope of the disclosure; the scopes of the disclosure are defined by the accompanying claims.

What is claimed is:

1. An organic light-emitting diode (OLED) array substrate, comprising a display region, and a first package test electrode and a first package test lead which are outside the display region, wherein the display region comprises a first power supply line and a first signal line;
    the first package test lead is configured to connect the first package test electrode with the first power supply line to provide a first supply voltage for the display region;
    the first signal line is configured to provide a first electrical signal for the display region; and
    a thermal conductivity of the first package test lead is higher than a thermal conductivity of the first signal line;
    the OLED array substrate further comprises a first module bonding pad and a first module bonding lead which are outside the display region, the first module bonding lead is configured to connect the first module bonding pad with the first power supply line.

2. The OLED array substrate according to claim 1, wherein the display region further comprises a second signal line which is configured to provide a second electrical signal for the display region; and
    the first package test lead and the second signal line are in a same layer and made of a same material.

3. The OLED array substrate according to claim 2, wherein the first signal line is a scanning line, and the second signal line is a data line.

4. The OLED array substrate according to claim 2, wherein the display region comprises a light emitting element and a pixel circuit for driving the light emitting element to emit light;
    the pixel circuit comprises a thin-film transistor; the thin film transistor comprises a source/drain electrode layer; and the source/drain electrode layer and the second signal line are in a same layer and made of a same material.

5. The OLED array substrate according to claim 4, wherein the thin film transistor comprises a gate electrode layer; and
    the gate electrode layer and the first signal line are in a same layer and made of a same material.

6. The OLED array substrate according to claim 4, wherein the first package test electrode and a conductive layer, which is farthest away from a base substrate, of the pixel circuit, are in a same layer and made of a same material.

7. The OLED array substrate according to claim 4, wherein the first package test electrode and the source/drain electrode layer are in a same layer and made of a same material.

8. The OLED array substrate according to claim 1, wherein the thermal conductivity of the first package test lead is greater than 138 W/(m·K).

9. The OLED array substrate according to claim 1, further comprising a second package test electrode and a second package test lead which are outside the display region, wherein
    the display region comprises a common electrode line;
    the second package test lead is configured to connect the second package test electrode with the common electrode line to provide a second supply voltage corresponding to the first supply voltage, the second supply voltage being lower than the first supply voltage.

10. The OLED array substrate according to claim 9, wherein the second package test lead is on a side of the first package test lead away from the display region.

11. The OLED array substrate according to claim 1, wherein the first package test electrode is in a block shape, and the first module bonding pad is in a comb structure.

12. An organic light-emitting diode (OLED) array substrate, comprising a display region, and a first package test electrode and a first package test lead which are outside the display region,
    wherein the display region comprises a first power supply line and a first signal line;
    the first package test lead is configured to connect the first package test electrode with the first power supply line to provide a first supply voltage for the display region;
    the first signal line is configured to provide a first electrical signal for the display region; and
    a thermal conductivity of the first package test lead is higher than a thermal conductivity of the first signal line;
    the OLED array substrate further comprises a first module bonding pad and a first module bonding lead which are outside the display region, the first module bonding lead is configured to connect the first module bonding pad with the first power supply line to provide a third supply voltage for the display region, and the first module bonding pad and the first package test electrode are on different sides of the display region.

13. The OLED array substrate according to claim 12, further comprising a second module bonding pad and a second module bonding lead which are outside the display region, wherein
the display region comprises a common electrode line; and
the second module bonding lead is configured to connect the second module bonding pad with the common electrode line to provide the display region with a fourth supply voltage corresponding to the third supply voltage.

14. The OLED array substrate according to claim 13, further comprising a light emitting element, wherein the light emitting element comprises a first electrode, a second electrode and a light emitting layer between the first electrode and the second electrode; and
the common electrode line is electrically connected with the first electrode or the second electrode of the light emitting element.

15. The OLED array substrate according to claim 13, wherein the second module bonding lead is on a side of the first module bonding lead away from the display region.

16. An electronic device, comprising the OLED array substrate according to claim 1, wherein the first package test electrode is floating.

17. The electronic device according to claim 16, further comprising a first module bonding pad and a first module bonding lead which are outside the display region, wherein
the first module bonding lead is configured to connect the first module bonding pad and the first power supply line to provide a third supply voltage for the display region.

18. The electronic device according to claim 17, further comprising
an integrated circuit (IC) chip, wherein the IC chip is electrically connected with the array substrate through the first module bonding pad to provide the first supply voltage or the first electrical signal for the OLED array substrate; and
a flexible printed circuit,
wherein the IC chip is bonded with the first module bonding pad via the flexible printed circuit.

19. The OLED array substrate according to claim 12, wherein two ends of the first power supply line are respectively electrically connected with the first package test electrode and the first module bonding pad.

20. An organic light-emitting diode (OLED) array substrate, comprising a display region, and a first package test electrode and a first package test lead which are outside the display region;
wherein the display region comprises a first power supply line and a first signal line;
the first package test lead is configured to connect the first package test electrode with the first power supply line to provide a first supply voltage for the display region;
the first signal line is configured to provide a first electrical signal for the display region; and
a first module bonding pad and a first module bonding lead which are outside the display region, the first module bonding lead is configured to connect the first module bonding pad with the first power supply line;
wherein the first package test electrode, the first package test lead, and the source/drain electrode layer are in a same layer and made of a same material, the first signal line and the gate electrode layer are in a same layer and made of a same material, a thermal conductivity of the first package test lead is higher than a thermal conductivity of the first signal line, and the thermal conductivity of the first package test lead is greater than 138 W/(m·K).

* * * * *